United States Patent
Oshima et al.

(10) Patent No.: US 8,379,402 B2
(45) Date of Patent: Feb. 19, 2013

(54) WIRING BOARD HAVING LEAD PIN, AND LEAD PIN

(75) Inventors: Kazuhiro Oshima, Nagano (JP);
Yoshikazu Hirabayashi, Nagano (JP);
Shigeo Nakajima, Nagano (JP);
Yoshitaka Matsushita, Nagano (JP)

(73) Assignee: Shinko Electric Industries Co., Ltd., Nagano-Shi (JP)

(*) Notice: Subject to any disclaimer, the term of this patent is extended or adjusted under 35 U.S.C. 154(b) by 273 days.

(21) Appl. No.: 12/633,443

(22) Filed: Dec. 8, 2009

(65) Prior Publication Data

US 2010/0139970 A1    Jun. 10, 2010

(30) Foreign Application Priority Data

Dec. 10, 2008    (JP) ................. 2008-313966

(51) Int. Cl.
*H01R 9/00* (2006.01)
(52) U.S. Cl. ........ 361/772; 361/773; 361/774; 174/267; 174/263
(58) Field of Classification Search .......... 361/772–774; 174/267, 263
See application file for complete search history.

(56) References Cited

U.S. PATENT DOCUMENTS

| | | | | |
|---|---|---|---|---|
| 4,787,853 A * | 11/1988 | Igarashi | ........................... | 439/55 |
| 6,181,219 B1 * | 1/2001 | Gailus et al. | ................... | 333/33 |
| 6,376,782 B1 * | 4/2002 | Kimura et al. | ................. | 174/267 |
| 7,422,449 B2 | 9/2008 | Ide et al. | | |
| 7,723,620 B2 | 5/2010 | Kawade et al. | | |
| 2004/0182604 A1 * | 9/2004 | Alcoe | ........................... | 174/267 |
| 2008/0136039 A1 * | 6/2008 | Eppler | ......................... | 257/774 |

FOREIGN PATENT DOCUMENTS

| | | |
|---|---|---|
| JP | 60-106375 | 7/1985 |
| JP | 60-106375 UM | 7/1985 |
| JP | 64-30853 UM | 2/1989 |
| JP | 3-100364 | 10/1991 |
| JP | 03-100364 UM | 10/1991 |
| JP | 2006-86283 A | 3/2006 |
| JP | 2006-344621 A | 12/2006 |

OTHER PUBLICATIONS

English translation JP2003-208938.*

* cited by examiner

*Primary Examiner* — Tuan T Dinh
*Assistant Examiner* — Steven Sawyer
(74) *Attorney, Agent, or Firm* — Rankin, Hill & Clark LLP

(57) ABSTRACT

A wiring board having a lead pin is provided. The wiring board having the lead pin includes a connecting pad which is formed on the wiring board, and to which the lead pin is bonded through a conductive material. The lead pin includes: a shaft portion; a head portion which is provided on one end of the shaft portion; a protruded portion which is formed on a surface side of the head portion opposed to the connection pad; and a first taper portion which is formed between the head portion and a base part of the shaft portion.

20 Claims, 11 Drawing Sheets

WIRING BOARD HAVING LEAD PIN, AND LEAD PIN

This application claims priority from Japanese Patent Application No. 2008-313966, filed on Dec. 10, 2008, the entire contents of which are hereby incorporated by reference.

FIELD OF THE INVENTION

The present invention relates to a wiring board having a lead pin, and the lead pin, and more particularly to a wiring board having a lead pin which is obtained by bonding the lead pin to a connecting pad formed on the wiring board through a conductive material, and the lead pin to be used therein.

DESCRIPTION OF RELATED ART

A wiring board having a lead pin which is formed by bonding the lead pin as an external connecting terminal to a connecting pad provided on the wiring board includes a product which is offered by bonding a lead pin 5 through a solder 14, for example, as a bonding material for a conduction to a connecting pad 12 formed on a wiring board 10 as shown in FIG. 13. FIG. 13 shows a wiring board having a lead pin which is formed by bonding, to the connecting pad 12, a head portion 5a of the so-called flat pin type lead pin 5 with the head portion 5a provided like a flat disc.

In case of the wiring board having a lead pin which uses the lead pin 5 having the flat head portion 5a, as shown in FIG. 14A, there is a problem in that a void A is apt to be generated between the head portion 5a and the connecting pad 12 and the lead pin 5 is tilted from an upright position to cause a failure when the lead pin 5 is bonded to the connecting pad 12 by a heating reflow. As shown in FIG. 14B, moreover, there is a problem in that the solder 14 is protruded toward a surface at an opposite side to a bonding surface of the head portion 5a to the connecting pad 12 and a variation in a bonding height of the lead pin 5 is thus caused when the lead pin 5 is bonded to the connecting pad 12.

As a method of solving the problems, there has been investigated a method of setting a bonding surface of a head portion of a lead pin to a connecting pad to take a shape of a hemispherical surface or providing a projection on a surface of the head portion which is bonded to the connecting pad, thereby regulating a bonding height of the lead pin depending on a height of the projection when bonding the lead pin to the connecting pad.

[Patent Document 1] JP-UM-A-60-106375
[Patent Document 2] JP-UM-A-03-100364

In a wiring board having a lead pin, the number of pins has been increased, and furthermore, a diameter of the lead pin has been reduced. For this reason, a bonding strength of the lead pin and a connecting pad formed on the wiring board has been more important than that in a related art. In the related art, the bonding strength is insufficient due to a reduction in a bonding area of the lead pin and a conductive material because of a decrease in a diameter of the lead pin, and furthermore, a pull strength is insufficient depending on a strength of the lead pin itself. Moreover, an increase in the bonding strength is inhibited due to the fact that a void remains in the conductive material to be used for bonding the lead pin. Furthermore, the conductive material is protruded toward a shaft portion beyond a head portion of the lead pin so that a removing/attaching property from/to a socket causes a problem.

SUMMARY OF INVENTION

Illustrative aspects of the present invention provide a wiring board having a lead pin which can ensure a sufficient bonding strength of the lead pin and a connecting pad formed on the wiring board and can be offered as a product having a high reliability even if the lead pin has a small diameter, and the lead pin to be used therein.

According to a first aspect of the invention, a wiring board having a lead pin includes a connecting pad which is formed on the wiring board, and to which the lead pin is bonded through a conductive material. The lead pin includes: a shaft portion; a head portion which is provided on one end of the shaft portion; a protruded portion which is formed on a surface side of the head portion opposed to the connection pad; and a first taper portion which is formed between the head portion and a base part of the shaft portion.

According to a second aspect of the invention, a wiring board having a lead pin includes a connecting pad which is formed on the wiring board, and to which the lead pin is bonded through a conductive material. The lead pin includes: a shaft portion; a head portion which is provided on one end of the shaft portion; a protruded portion which is formed on a surface side of the head portion opposed to the connection pad; and a trench which is formed on a surface of the head portion opposed to the connection pad.

According to a third aspect of the invention, a wiring board having a lead pin includes a connecting pad which is formed on the wiring board, and to which the lead pin is bonded through a conductive material. The lead pin includes: a shaft portion; a head portion which is provided on one end of the shaft portion; a protruded portion which is formed on a surface side of the head portion opposed to the connection pad. And, an external surface of the protruded portion and a surface of the head portion opposed to the connection pad are smoothly connected to each other through a continuous curved surface.

Other aspects and advantages of the invention will be apparent from the following description, the drawings and the claims.

DETAILED DESCRIPTION OF EXEMPLARY EMBODIMENTS

First Exemplary Embodiment

Figure 1A:
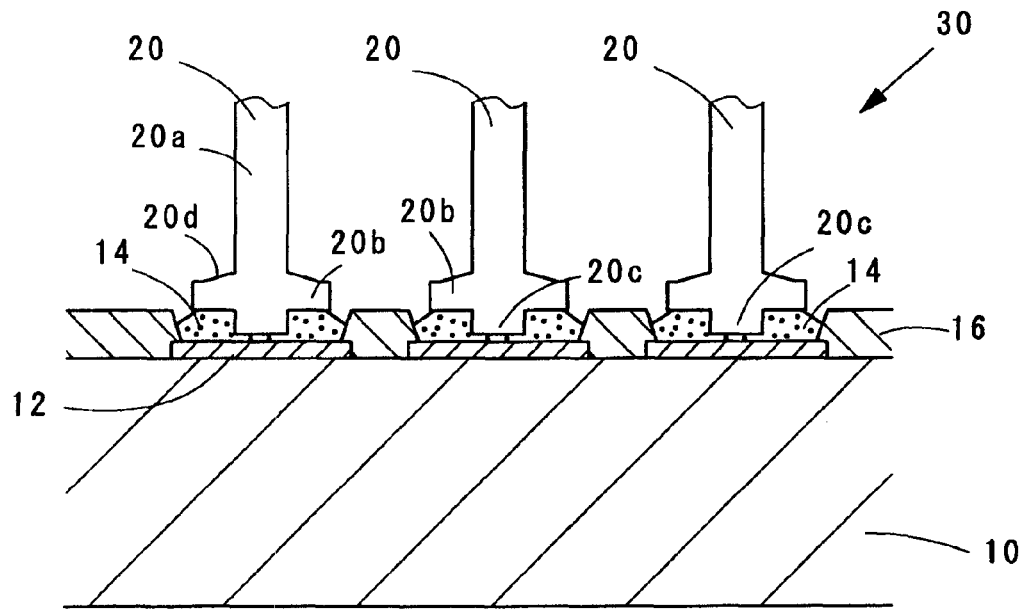
FIGS. 1A and 1B are sectional views showing a first embodiment of a wiring board having a lead pin.
Figure 1B:
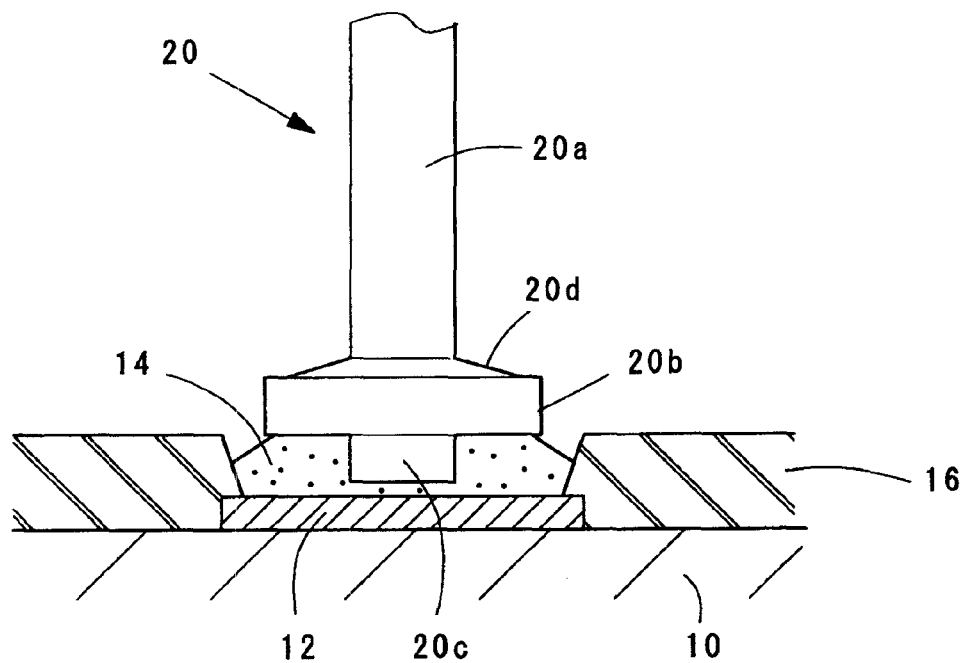

FIGS. 1A and 1B are sectional views showing a wiring board 30 having a lead pin according to a first exemplary embodiment of the present invention. FIG. 1A is a sectional view showing a structure of a main part of a wiring board 30 having a lead pin and FIG. 1B shows the enlarged vicinity of a bonding portion of a lead pin 20 and a connecting pad 12. In FIG. 1B, the lead pin 20 portion is illustrated in a front shape in order to easily understand a shape of the lead pin 20. The drawing showing the enlarged bonding portion of the lead pin 20 will be given in the same manner.

The wiring board 30 having a lead pin is formed by bonding the lead pin 20 to the connecting pad 12 provided on one of surfaces of a wiring board 10 through a solder 14 as a bonding conductive material.

In the wiring board 10, one of the surfaces is formed as a bonding surface of an external connecting terminal to bond the lead pin 20 and the other surface is formed as an element mounting surface for mounting a semiconductor device thereon. One of the surfaces in the wiring board 10 is covered with a covering material 16 such as a solder resist except for a region in which the connecting pad 12 is formed, and the connecting pad 12 takes a planar shape which is exposed circularly.

The connecting pad 12 is formed by a copper layer, and nickel plating and gold plating are carried out as protective plating over a surface of the copper layer in this order.

A method of forming a wiring pattern including the connecting pad 12 on a surface of a wiring board is based on a general wiring pattern forming method such as a build-up method.

An operation for bonding the lead pin 20 to the wiring board 10 is carried out in the following manner.

First of all, a solder paste is applied as a conductive material to an exposed surface of the connecting pad 12. Subsequently, the lead pin 20 is supported in an arrangement which is coincident with a planar arrangement of the connecting pad 12 by means of a support jig, and is caused to pass through a heating reflow device in a state in which the support jig and the wiring board 10 are aligned with each other. Thus, the lead pin 20 is bonded to the wiring board 10. After the lead pin 20 is bonded to the wiring board 10, the support jig is removed to obtain the wiring board 30 having the lead pin.

The support jig has a function for aligning the lead pin 20 with the connecting pad 12 and supporting the lead pin 20 to be bonded to a substrate surface of the wiring board 10 in an upright state. A set hole for setting the lead pin 20 which is provided on the support jig is formed to have an inside diameter with a slight clearance with respect to a diameter of a shaft portion 20a of the lead pin 20 in consideration of an operation for positioning the lead pin 20 and an operation for removing/inserting the shaft portion 20a of the lead pin 20 therefrom/therein.

In the lead pin 20 to be used in the wiring board having the lead pin according to the first exemplary embodiment, one of ends of the shaft portion 20a is provided with a head portion 20b taking a planar shape of a circular plate, and a protruded portion 20c is formed concentrically with the shaft portion 20a on a surface of the head portion 20b which is opposed to the connecting pad 12 as shown in FIG. 1B.

In the first exemplary embodiment, an outside diameter of the protruded portion 20c is set to be equal to that of the shaft portion 20a. Moreover, a tip of the protruded portion 20c is formed to take a vertical cutting configuration with respect to an axial direction of the shaft portion 20a, that is, the protruded portion 20c is formed to take a shape of a short cylinder which has an end face to be a flat surface.

Furthermore, positions of base parts of the protruded portion 20c and the head portion 20b have rectangular sections. On the other hand, a surface side of the head portion 20b to which the shaft portion 20a is integrally coupled is set to be a taper portion 20d obtained by linearly chamfering a portion between a base part of the shaft portion 20a and the head portion 20b in a sectional shape.

In a state in which the lead pin 20 is bonded to the connecting pad 12, the solder 14 is filled in a portion between a lower surface of the head portion 20b (an opposed surface to the connecting pad 12) and the connecting pad 12. An outside diameter of the head portion 20b of the lead pin 20 is slightly smaller than an opening diameter of the covering material 16. In a state in which the lead pin 20 is bonded to the connecting pad 12, a slight clearance is formed between an outer peripheral edge of the head portion 20b and an inner peripheral edge of the covering material 16.

A quantity of the solder 14 supplied to the connecting pad 12 is almost equal to such a quantity as to fill a region surrounded by the connecting pad 12, an opening side surface of the covering material 16 and the lower surface of the head portion 20b.

The lead pin 20 is bonded to the connecting pad 12 with a protruded end face of the protruded portion 20c opposed to a surface of the connecting pad 12. The solder 14 is also present thinly between the protruded end face of the protruded portion 20c and the surface of the connecting pad 12 and fills in a portion between the surface of the connecting pad 12 and the lower surface of the head portion 20b of the lead pin 20. In other words, a bonding region of the solder 14 and the lead pin 20 in the bond of the lead pin 20 to the connecting pad 12 is obtained by putting an external surface of the protruded portion 20c and the lower surface of the head portion 20b together.

In the wiring board 30 having the lead pin according to the first exemplary embodiment, there is used the lead pin 20 in which the protruded portion 20c is provided on the head portion 20b. As compared with the case in which a lead pin including a simple head portion is used, therefore, it is possible to increase a contact surface area in the bonding portion of the solder 14 and the lead pin 20. Thus, it is possible to increase a bonding strength of the lead pin 20 and the connecting pad 12.

Moreover, the end face of the protruded portion 20c which is opposed to the connecting pad 12 is formed to be a flat surface. Therefore, the lead pin 20 is bonded in an erecting state with the end face of the protruded portion 20c placed in parallel with the surface of the connecting pad 12. Consequently, the lead pin 20 can easily be bonded in an upright state.

Moreover, the protruded portion 20c of the lead pin 20 has a function for controlling a height position from the surface of the connecting pad 12 to the lower surface of the head portion 20b in the bond of the lead pin 20 to the connecting pad 12. By regulating the height of the protruded portion 20c, it is possible to define a height of a tip of the lead pin 20 in the bond of the lead pin 20 to the connecting pad 12. Thus, it is possible to reduce a variation in the height of the lead pin 20 in a state in which the lead pin 20 is attached.

By regulating a distance from the surface of the connecting pad 12 to the lower surface of the head portion 20b, furthermore, it is possible to regulate the filling state of the solder 14 in the bond of the lead pin 20 to the connecting pad 12. Consequently, it is possible to prevent the solder 14 from being protruded toward a side surface of the head portion 20b or the shaft portion 20a side beyond the head portion 20b.

In the first exemplary embodiment, moreover, the taper portion 20d is provided on the side of the head portion 20b to which the shaft portion 20a is coupled. As compared with a lead pin formed to have a flat pin type, therefore, a strength of a coupling part of the head portion 20b and the shaft portion 20a can be enhanced more greatly. When the lead pin 20 is pulled, thus, it is possible to prevent the coupling part from being broken, thereby enhancing a pull strength of the lead pin 20.

In the first exemplary embodiment, the outside diameter of the protruded portion 20c is set to be equal to that of the shaft portion 20a. In a process for manufacturing the lead pin 20, a wire having a predetermined diameter is subjected to a press processing to form the lead pin 20 having the head portion 20b. In the case in which the protruded portion 20c is set to have an equal diameter to that of the shaft portion 20a, it is possible to easily carry out a process for performing the processing over the wire, thereby manufacturing the lead pin. The protruded portion 20c does not need to have the equal diameter to that of the shaft portion 20a in the lead pin 20 but may have a smaller or larger diameter than that of the shaft portion 20a.

Second Exemplary Embodiment

Figure 2A:
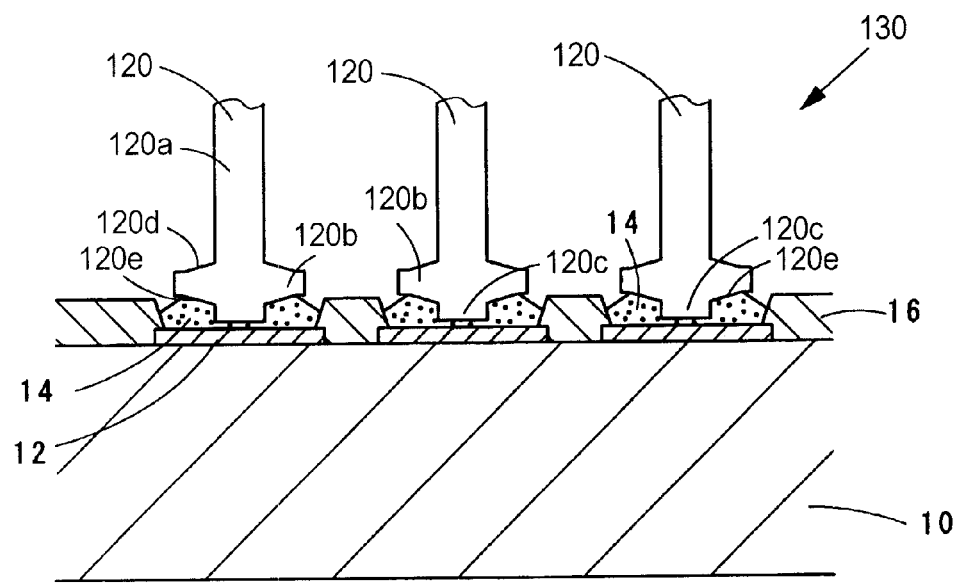
FIGS. 2A and 2B are sectional views showing a second embodiment of the wiring board having a lead pin.

FIG. 2A is a sectional view showing a wiring board 130 having a lead pin according to a second exemplary embodiment of the present invention.

For a lead pin 120 according to the second exemplary embodiment which is to be used, similarly, a protruded portion 120c is formed concentrically with a shaft portion 120a at a surface side of a head portion 120b which is to be bonded to a connecting pad 12.

Referring to a different structure from the lead pin 20 used in the first exemplary embodiment, a taper portion 120e to be a chamfered portion taking a linear sectional shape is provided between a base part of the protruded portion 120c and the head portion 120b. The other structures of the lead pin 120 of the second exemplary embodiment are the same as those of the lead pin 20 of the first exemplary embodiment shown in FIGS. 1A and 1B.

In the second exemplary embodiment, the taper portion 120e is provided between the head portion 120b and the protruded portion 120c. Therefore, a void remains in a solder 14 for bonding the lead pin 120 to the connecting pad 12 with difficulty.

The reason is as follows. The taper portion 120e is provided on a lower surface of the head portion 120b (an opposed surface to the connecting pad 12). Consequently, the void generated in the solder 14 is easily moved along an inclined surface of the taper portion 120e (is moved from a central side of the head portion 120b toward an outside in FIGS. 2A and 2B). Thus, there is taken an action for discharging the void from an inside of the solder 14.

According to a shape of the lead pin 120 in accordance with the second exemplary embodiment, the void is prevented from remaining in the solder 14 filled between the head portion 120b and the connecting pad 12. As compared with the case in which the void remains in the solder 14, therefore, it is possible to enhance a bonding strength of the lead pin 120 and the connecting pad 12 more greatly. By preventing the void from remaining in the solder 14, moreover, it is possible to inhibit the lead pin 120 from being bonded with a tilt.

Furthermore, the taper portions 120d and 120e are respectively provided on the base parts of the head portion 120b and the shaft portion 120a and those of the head portion 120b and the protruded portion 120c. Consequently, it is possible to enhance a strength of a coupling part. Thus, it is possible to prevent the coupling part from being broken when the lead pin 120 is pulled, thereby enhancing a pull strength of the lead pin 120.

Third Exemplary Embodiment

Figure 3A:
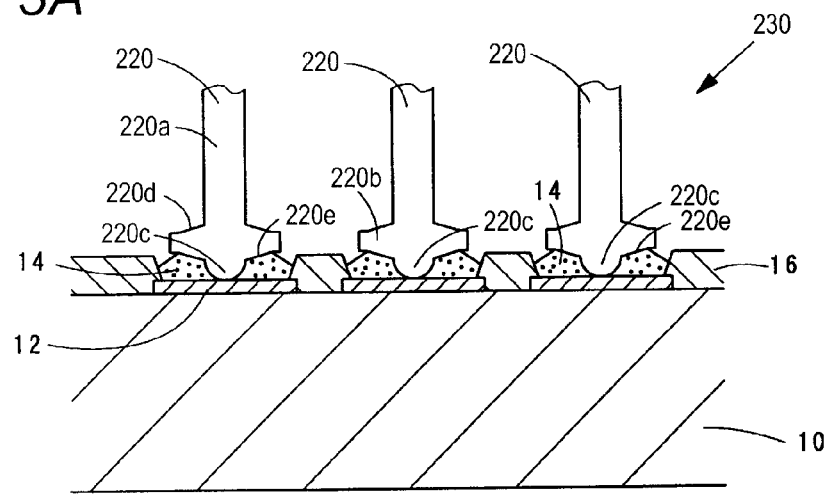
FIGS. 3A to 3C are sectional views showing a third embodiment of the wiring board having a lead pin.
Figure 3B:
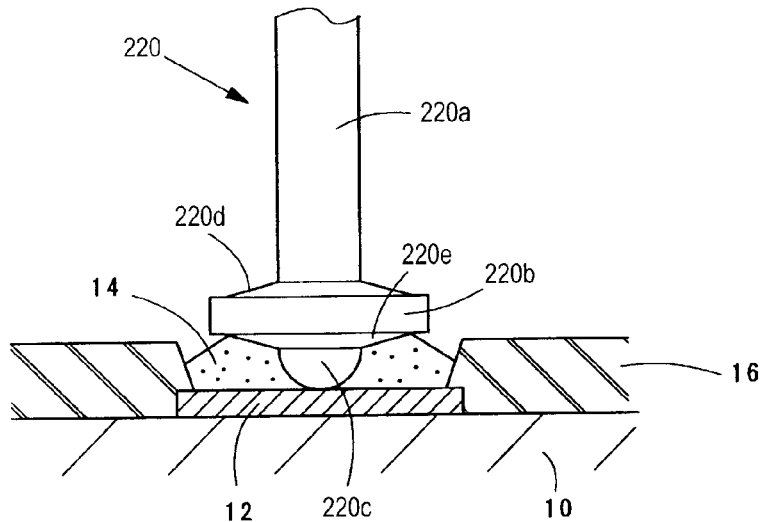

FIGS. 3A and 3B are sectional views showing a wiring board 230 having a lead pin according to a third exemplary embodiment of the present invention.

In a lead pin 220 according to the third exemplary embodiment, similarly, a protruded portion 220c is formed concentrically with a shaft portion 220a at a surface side of a head portion 220b which is to be bonded to a connecting pad 12, and a taper portion 220d is provided between a base part of the shaft portion 220a and the head portion 220b and a taper portion 220e is provided between a base part of the protruded portion 220c and a lower surface of the head portion 220b.

Figure 2B:
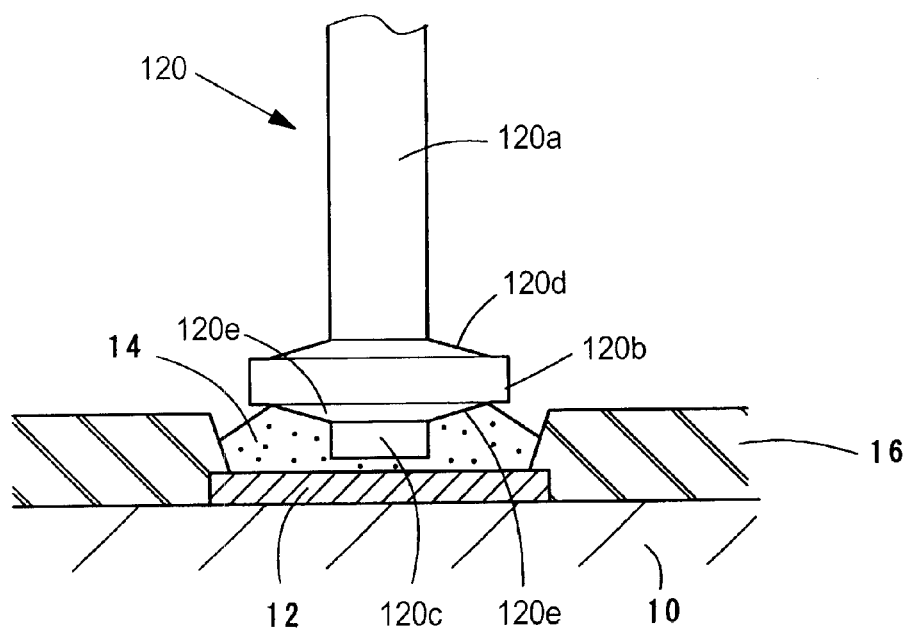

Referring to a different structure from the lead pin 120 used in the second exemplary embodiment shown in FIGS. 2A and 2B, the protruded portion 220c is formed to take a shape of a hemisphere which is convexed toward the connecting pad 12. In other words, the protruded portion 220c is formed to take a shape of a projection which has a hemispherical external surface from the taper portion 220e. The other structures of the lead pin 220 of the third exemplary embodiment are the same as those of the lead pin 120 of the second exemplary embodiment.

A protruding height of the protruded portion 220c is set to fill a part between the connecting pad 12 and the lower surface of the head portion 220b with a solder 14 in a state in which the lead pin 220 is bonded to the connecting pad 12. An external surface of the protruded portion 220c is formed to take a shape of a hemispherical surface. Consequently, the lead pin 220 is bonded to the connecting pad 12 in a state in which a protruded end (a top part) of the protruded portion 220c almost comes in contact with a surface of the connecting pad 12.

In the wiring board 230 having the lead pin 220 according to the third exemplary embodiment, the external surface of the protruded portion 220c is set to take the shape of the hemispherical surface which is convexed toward the connecting pad 12. Consequently, a void can be prevented from being caught between an end face of the protruded portion 220c and the connecting pad 12. In addition, the void generated in the solder 14 is discharged more easily than in the first and second exemplary embodiments shown in FIGS. 1A to 2B.

In the lead pins 20 and 120 shown in FIGS. 1A to 2B, the protruded portion 20c or 120c is formed to take a shape of a short cylinder. For this reason, there is a possibility that the void might be caught between the end face of the protruded portion 20c or 120c which is opposed to the connecting pad 12 and the connecting pad 12. In the third exemplary embodiment, the protruded portion 220c is formed to take the hemispherical shape. Therefore, the void can be prevented from being caught between the top part of the protruded portion 220c and the surface of the connecting pad 12. The void generated in the solder 14 is moved from a lower part toward an upper part along the external surface taking the shape of the hemispherical surface in the protruded portion 220c and can be thus discharged from an inside of the solder 14 easily.

Figure 3C:
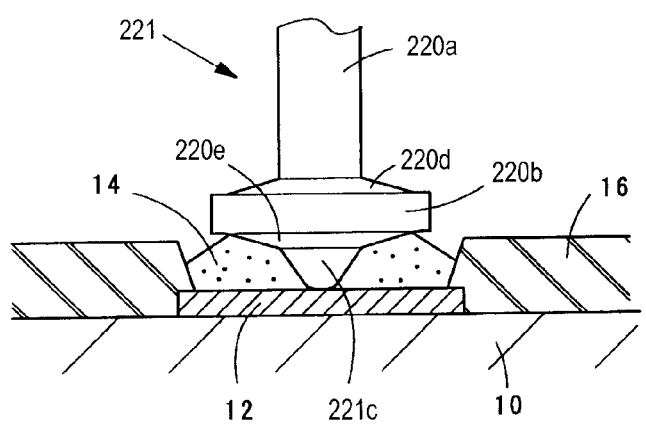

FIG. 3C shows a protruded portion 221c in a lead pin 221 in which the external surface of the protruded portion 221c takes a shape of a smooth curved surface with an opposed side to the connecting pad 12 convexed. In the lead pin 221, there is taken a conical shape in which a tip side of the protruded portion 221c has a diameter reduced gradually toward the connecting pad 12. The tip part of the protruded portion 221c is chamfered to take the shape of the hemispherical surface. In the case of the protruded portion 220c formed to take the hemispherical shape, an interval between the external surface of the protruded portion 220c and the surface of the connecting pad 12 is reduced at the tip side of the protruded portion 220c so that a void might remain in the small interval portion. On the other hand, in the case of the protruded portion 221c, the external surface of the protruded portion 221c is formed to be a taper surface in a sectional shape. Consequently, the interval between the connecting pad 12 and the external surface of the protruded portion 221c is increased so that the void can easily be removed from the inside of the solder 14.

Also in the third exemplary embodiment, the solder 14 is stuck to the taper portion 220e and the external surface of the protruded portion 220c or 221c. As compared with the case of a flat pin, therefore, it is possible to increase a bonding area of the solder 14 and the lead pin 220 or 221, thereby enhancing a bonding strength of the lead pin 220 or 221 and the connecting pad 12 more greatly.

Although an outside diameter of the protruded portion 220c or 221c in a position in which it is to be coupled to the head portion 220b is set to be equal to that of the shaft portion 220a in the third exemplary embodiment, the diameter of the protruded portion 220c or 221c can be selected properly and may be set to be larger or smaller than the diameter of the shaft portion 220a.

Fourth Exemplary Embodiment

Figure 4A:
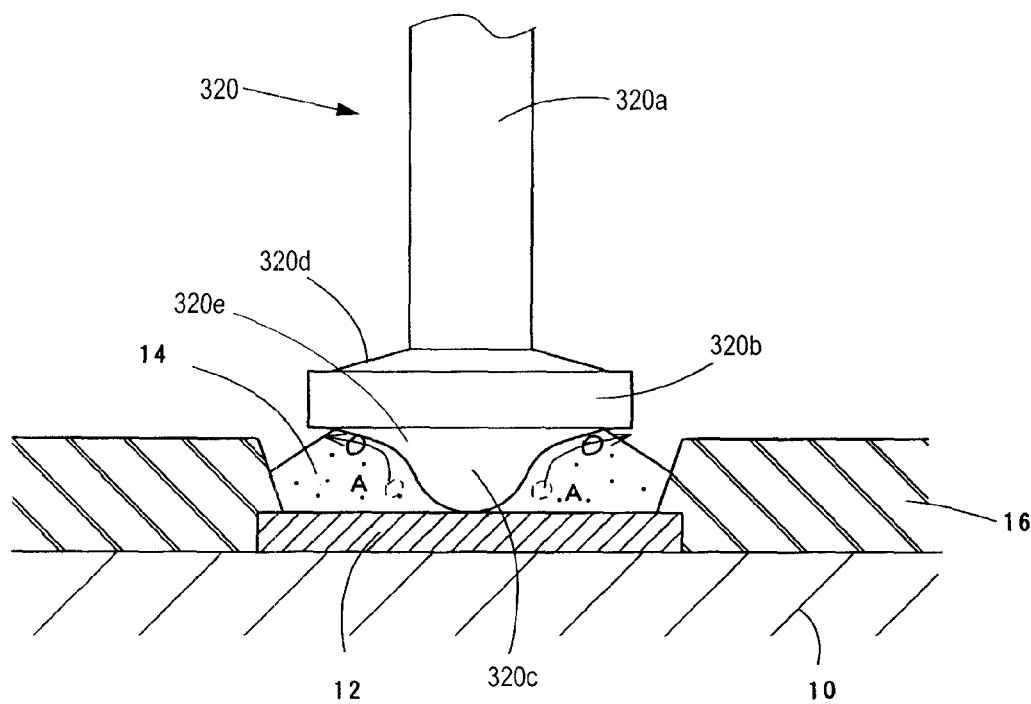
FIGS. 4A and 4B are sectional views showing a fourth embodiment of the wiring board having a lead pin.
Figure 4B:
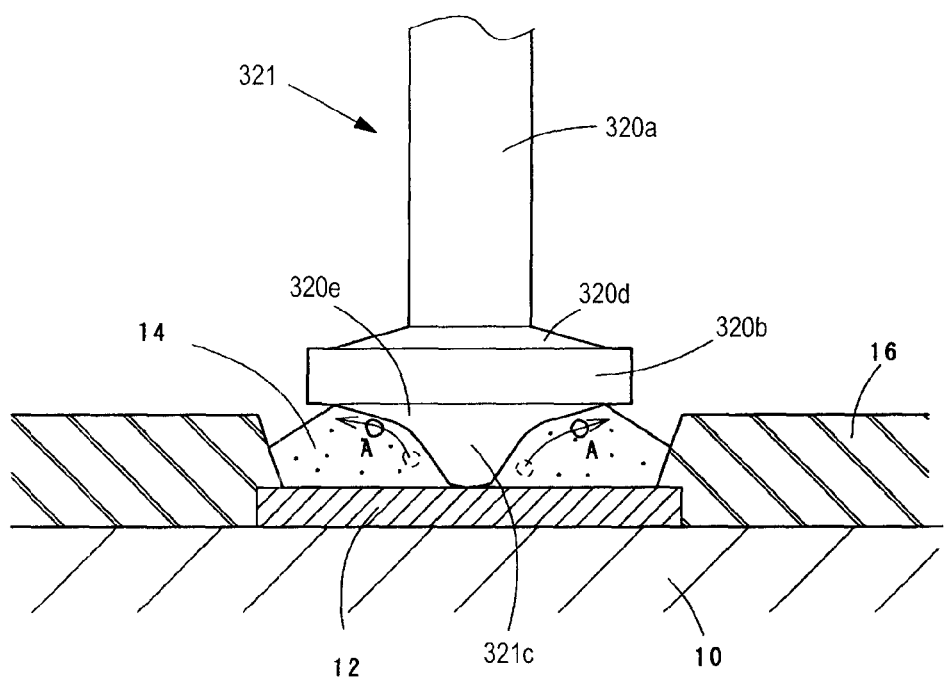

FIGS. 4A and 4B are sectional views showing a lead pins 320 and 321 according to a fourth exemplary embodiment of the present invention. In the fourth exemplary embodiment, an external surface of a protruded portion 320c or 321c and an external surface of a taper portion 320e on a lower surface of a head portion 320b are provided continuously through a smooth curved surface.

FIGS. 4A and 4B show example in which a coupling part of the external surface of the protruded portion 320c or 321c and the taper portion 320e is chamfered like a curved surface for the lead pin 320 including the protruded portion 320c having the external surface taking the shape of the hemispherical surface and the lead pin 321 including the protruded portion 321c having the external surface taking the shape of the conical surface, respectively.

When the external surface of the protruded portion 320c or 321c and the lower surface of the head portion 320b are formed to be a smooth and continuous curved surface, thus, a void generated in a solder 14 can be discharged more effectively as compared with that in the third exemplary embodiment of the lead pin 220 shown in FIGS. 3A to 3C.

FIGS. 4A and 4B typically show, in an arrow, a condition in which a void A in the solder 14 is moved in the solder 14 and is thus discharged. An operation for bonding the lead pin 320 or 321 to a connecting pad 12 by using the solder 14 is based on a method of carrying out bonding by supporting the lead pin 320 or 321 in an upright state through a support jig and causing them to pass through a heating reflow device as described above. At the heating step, the lead pin 320 or 321 is bonded with a shaft portion 320a set in a vertical and upward direction as shown in FIGS. 4A and 4B. Accordingly, the void A generated in the solder 14 to be fused between the head portion 320b of the lead pin 320 or 321 and the connecting pad 12 is moved from a lower part toward an upper part in the drawing by an action of a buoyancy.

The void A generated in the vicinity of a center of the connecting pad 12 is moved in an upward direction along the external surface of the protruded portion 320c or 321c and the lower surface of the head portion 320b. By setting the protruded portion 320c or 321c and the lower surface of the head portion 320b to be the continuous and smooth curved surface, therefore, the void A can easily be moved and discharged from an inside of the solder 14 to an outside.

The method of setting the lower surface of the head portion 320b and the external surface of the protruded portion 320c or 321c in the lead pin 320 or 321 to be the smooth curved surface as in the fourth exemplary embodiment is not restricted to the exemplary embodiment but can also be applied to the lead pin including the protruded portion 20c or 120c taking the shape of the short cylinder shown in FIGS. 1A to 2B and other exemplary embodiments.

Fifth Exemplary Embodiment

Figure 5A:
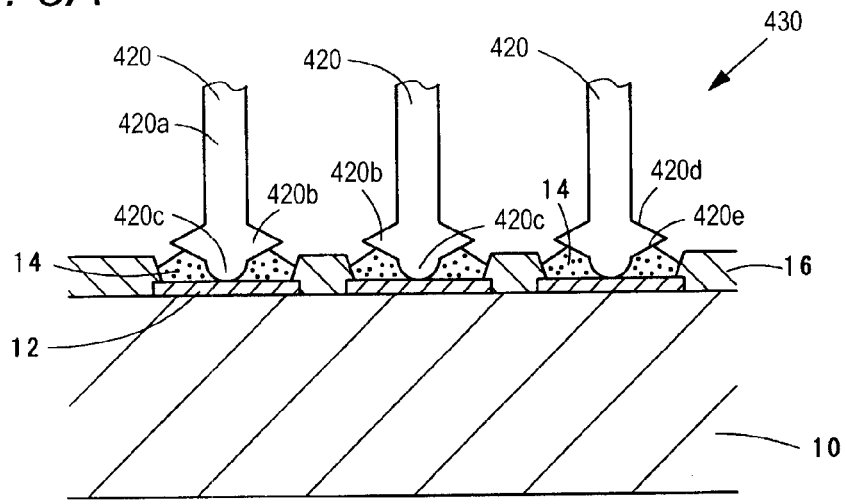
FIGS. 5A to 5C are sectional views showing a fifth embodiment of the wiring board having a lead pin.
Figure 5B:
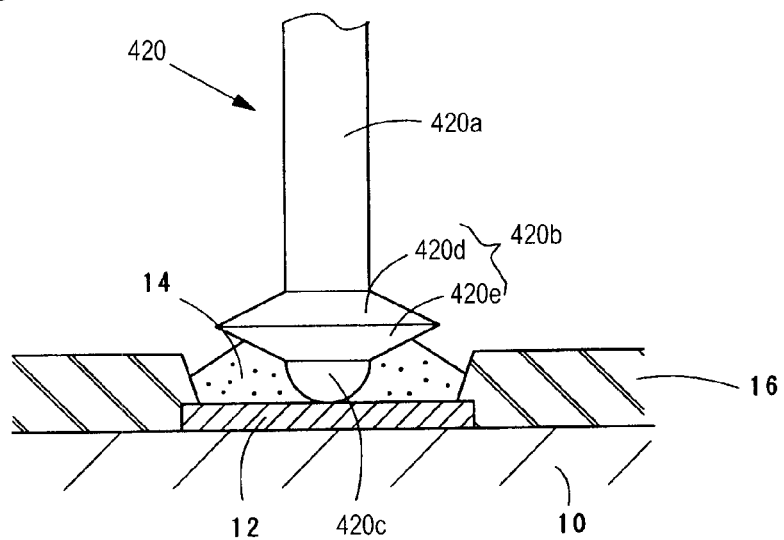

FIGS. 5A and 5B are sectional views showing a wiring board 430 having a lead pin according to a fifth exemplary embodiment of the present invention.

In a lead pin 420 shown in FIGS. 5A and 5B, similarly, a head portion 420b is provided with a protruded portion 420c in an opposed arrangement to a connecting pad 12.

In the lead pin 420 according to the fifth exemplary embodiment, both surfaces of the head portion 420b on a side to which a shaft portion 420a is to be coupled and a side to which the protruded portion 420c is to be coupled are formed by taper portions 420d and 420e, respectively, and the taper portions 420d and 420e are formed to take such a shape as to divide the head portion 420b into two parts in a vertical direction.

By taking such a configuration as to divide the head portion 420b into two parts of the taper portions 420d and 420e in the vertical direction, it is possible to increase a tilt angle of the taper portion 420e on a lower surface of the head portion 420b (an opposed surface to the connecting pad 12) more greatly as compared with the lead pin 320, 321 of the fourth exemplary embodiment shown in FIGS. 4A and 4B, for example. In other words, if a design for forming the taper portions 420d and 420e to divide the head portion 420b into two parts in the vertical direction is set on a condition that a thickness of the head portion 420b is constant, it is possible to increase at least an angle of the taper portion 420e in the head portion 420b which is opposed to the connecting pad 12 more greatly as compared with a lead pin in which a base part of the protruded portion 20c and the head portion 20b are simply chamfered.

If the tilt angle of the taper portion 420e can be increased, a void can easily be discharged from an inside of a solder 14 and can be thus prevented from remaining in the solder 14.

In the lead pin 420 according to the fifth exemplary embodiment, in the case in which the surface of the head portion 420b which is opposed to the connecting pad 12 is set to be an inclined surface, the void can easily be discharged from the solder 14 by utilizing the thickness of the head portion 420b.

Figure 5C:
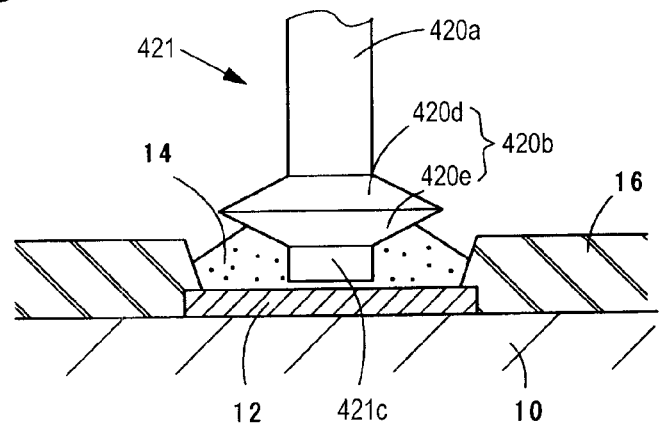

Although both of the lower and upper surfaces of the head portion 420b are set to be the taper portions in the fifth exemplary embodiment, it is preferable that the upper surface of the head portion 420b should be a flat surface and the lower surface of the head portion 420b should be an inclined surface corresponding to a total thickness of the head portion 420b in order to maximize the tilt angle of the surface of the head portion 420b which is opposed to the connecting pad 12. In consideration of a strength of the lead pin 420 itself, it is suitable to take the configuration in which the taper portions 420d and 420e are provided on both of the upper and lower surfaces of the head portion 420b as shown in FIGS. 5A to 5C.

FIGS. 5A and 5B show the lead pin 420 in which an external surface of the protruded portion 420c takes a shape of a spherical surface. FIG. 5C shows a lead pin 421 in which a protruded portion 421c is formed to take a shape of a short cylinder. The shape of the head portion 420b according to the fifth exemplary embodiment can be employed irrespective of the configuration of the protruded portion.

Sixth Exemplary Embodiment

Figure 6A:
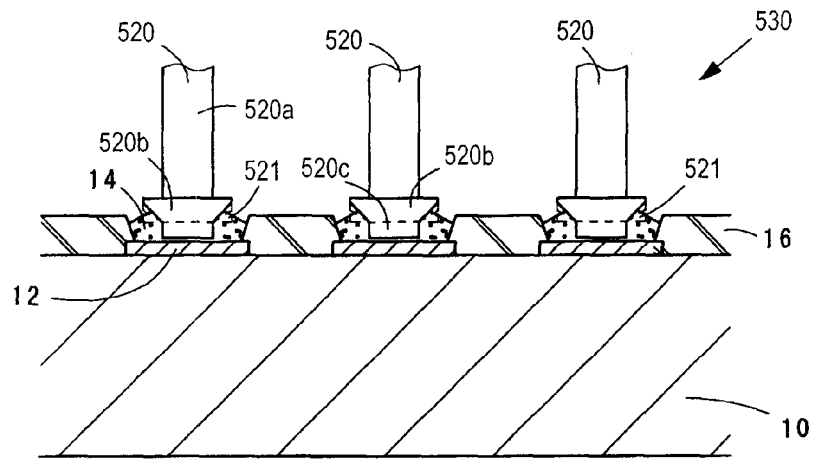
FIGS. 6A and 6B are sectional views showing a sixth embodiment of the wiring board having a lead pin.
Figure 6B:
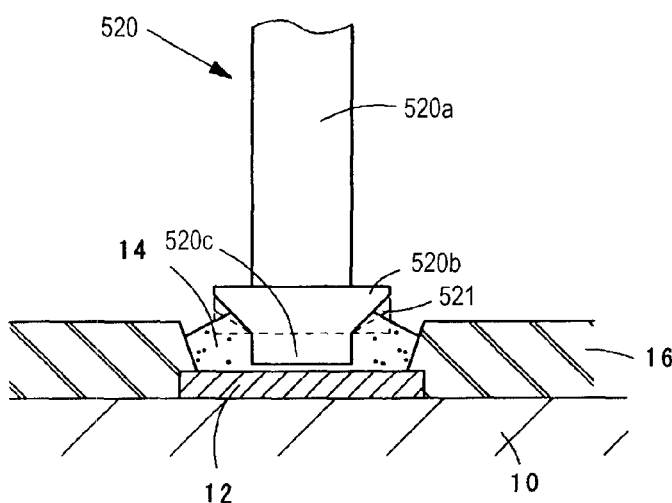

FIGS. 6A and 6B are sectional views showing a wiring board 530 having a lead pin according to a sixth exemplary embodiment of the present invention. A lead pin 520 to be used in the wiring board 530 according to the sixth exemplary embodiment includes a protruded portion 520c taking a shape of a short cylinder on a surface side of a head portion 520b which is opposed to a connecting pad 12, and includes a trench 521 for discharging a void on the surface of the head portion 520b which is opposed to the connecting pad 12.

Figure 7A:
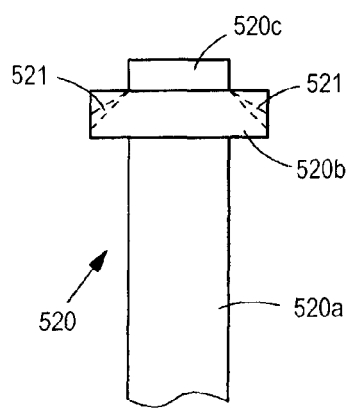
FIGS. 7A to 7C are front and bottom views showing the lead pin.
Figure 7B:
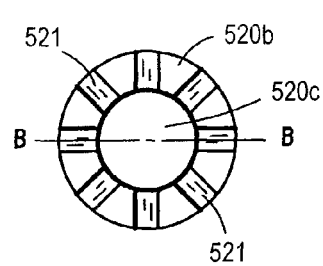
Figure 7C:
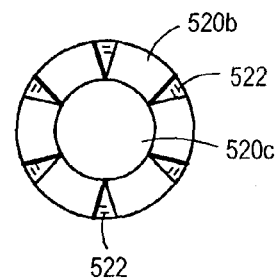

FIG. 7A is a front view showing the lead pin 520 and FIGS. 7B and 7C are plan views showing the lead pin 520 seen from the surface side on which the protruded portion 520c is formed. FIG. 7B shows the lead pin 520 in which the trench 521 is formed on the head portion 520b, and FIG. 7C shows the lead pin 520 in which a trench 522 is formed on the head portion 520b. In FIG. 7B, the trench 521 is provided in eight places in a uniform arrangement in a circumferential direction with such a shape as to have an equal width from an outer peripheral edge of the protruded portion 520c to that of the head portion 520b. In FIG. 7C, the trench 522 is provided in six places in a uniform arrangement in a circumferential direction with such a shape as to gradually increase a width from the outer peripheral edge of the protruded portion 520c to that of the head portion 520b.

As shown in FIG. 7A, the trench 521 is formed to take a tilting shape from a position of a base part of the protruded portion 520c to an outer periphery of the head portion 520b.

FIG. 6B shows a sectional view taken along a B-B line in FIG. 7B. In a portion of the lead pin 520 in which the trench 521 is formed, an internal surface (a side surface) of the trench 521 is formed as an inclined surface which is gradually separated from the connecting pad 12 from the position of the base part of the protruded portion 520c toward the outer peripheral edge of the head portion 520b. Namely, the internal surface of the trench 521 is formed as an inclined surface which is gradually taken in a high position with respect to the surface of the connecting pad 12 from the position of the base part of the protruded portion 520c toward the outer peripheral edge of the head portion 520b.

In the case of the lead pin 520 according to the sixth exemplary embodiment, accordingly, a void generated in a solder 14 filled between the head portion 520b and the connecting pad 12 can easily be discharged via the trench 521. The lead pin 520 is formed to take a shape of a simple flat disc in an appearance. By forming the trench 521 on the head portion 520b, however, it is possible to discharge the void from the solder 14 filled between the head portion 520b and the connecting pad 12, thereby enhancing a bonding strength of the lead pin 520 and the connecting pad 12.

It is possible to properly set the shape of the trench 521 to be formed on the head portion 520b and the number of the trenches 521 to be arranged.

Figure 8A:
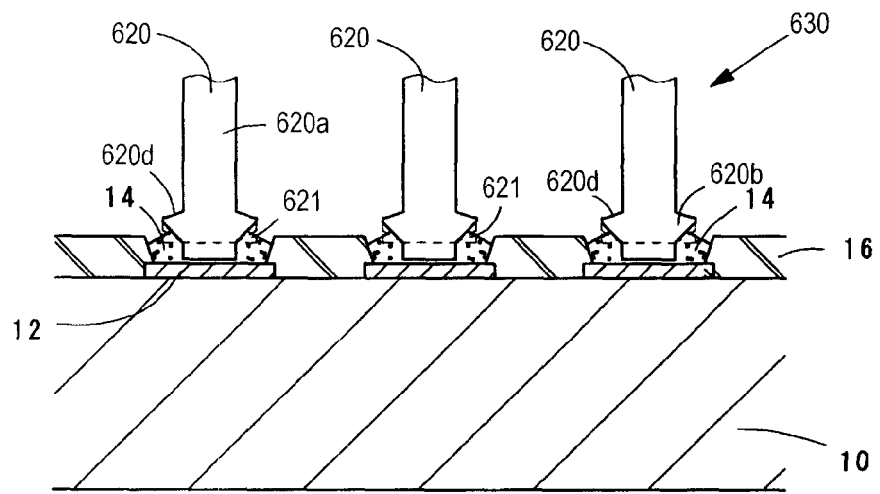
FIGS. 8A and 8B are sectional views showing a variant of the sixth embodiment and FIG. 8C is a front view showing the lead pin.
Figure 8B:
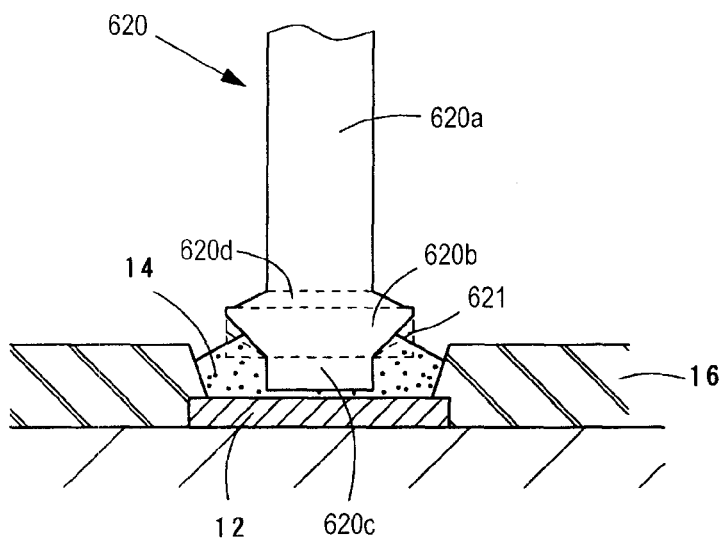
Figure 8C:
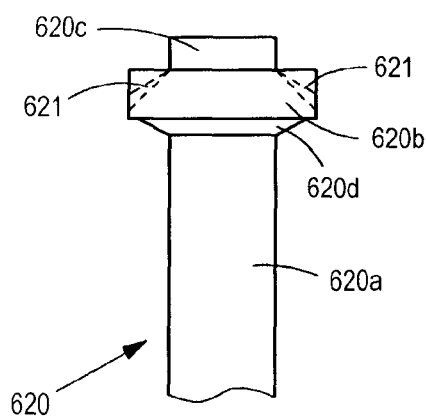

FIGS. 8A to 8C show a variant of the sixth exemplary embodiment. A lead pin 620 to be used in the variant has a taper portion 620d formed in positions of base parts of a head portion 620b and a shaft portion 620a. FIGS. 8A and 8B are sectional views showing a wiring board 630 having the lead pin 620 and FIG. 8C is a front view showing the lead pin 620. Referring to the lead pin 620 according to the variant, the taper portion 620d is provided corresponding to an action for discharging a void generated in a solder 14 from a trench 621. Consequently, it is possible to enhance a strength of a coupling part of the head portion 620b and the shaft portion 620a, thereby preventing a breakage in the coupling part. In addition, it is possible to enhance a pull strength in a bond of the lead pin 620 to a connecting pad 12 more greatly as compared with the example shown in FIGS. 7A to 7C.

Moreover, the trench 621 is formed on the head portion 620b. As compared with the case in which the head portion 20b is formed to take a shape of a simple flat disc, consequently, it is possible to increase a bonding area of the solder 14 and the lead pin 620, thereby enhancing a bonding strength of the lead pin 620.

Seventh Exemplary Embodiment

Figure 9A:
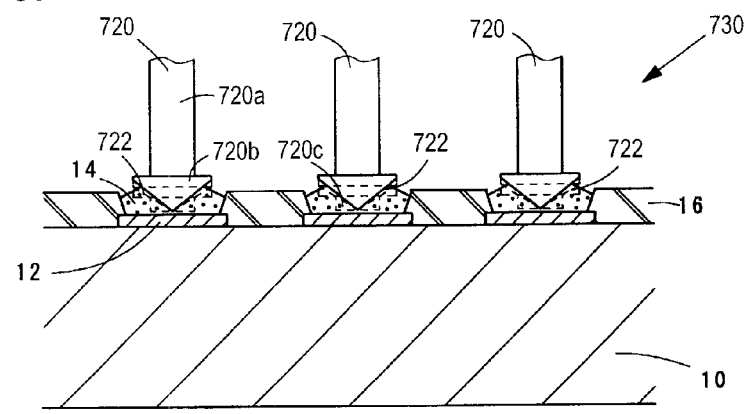
FIGS. 9A and 9B are sectional views showing a seventh embodiment of the wiring board having a lead pin.
Figure 9B:
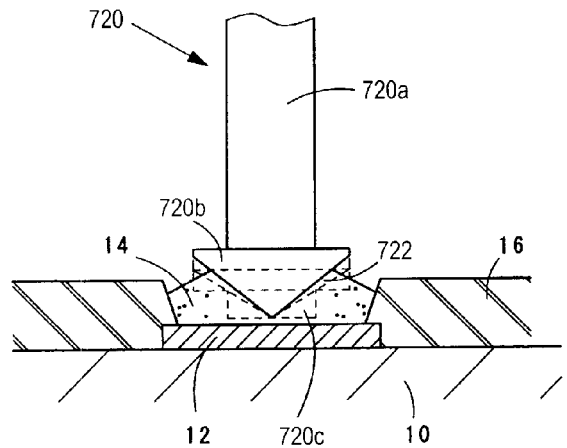

FIGS. 9A and 9B are sectional views showing a wiring board 730 having a lead pin according to the seventh present invention. A lead pin 720 to be used in the wiring board 730 having the lead pin according to the seventh exemplary embodiment includes a protruded portion 720c which is protruded like a short cylinder from an opposite surface to a surface of a head portion 720b to which a shaft portion 720a is coupled, and a trench 722 for discharging a void is provided from the protruded portion 720c to the head portion 720b.

Figure 10A:
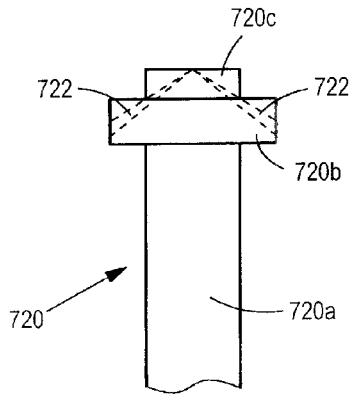
FIGS. 10A to 10C are front and bottom views showing the lead pin.
Figure 10B:
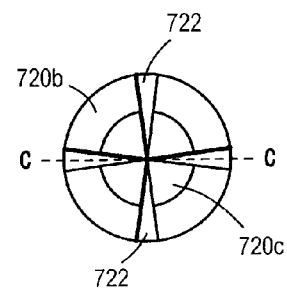
Figure 10C:
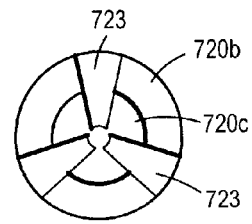

FIG. 10A is a front view showing the lead pin 720 and FIGS. 10B and 10C are plan views showing the lead pin 720 as seen from a surface side on which the protruded portion 720c is formed. The trench 722 is formed to take a communicating shape from a vicinal position of a center of the protruded portion 720c toward an outer peripheral edge of the head portion 720b. Although a surface of the trench 722 which is opposed to a connecting pad 12 is formed to be a linear inclined surface in the seventh exemplary embodiment, the trench 722 may take a shape of a curve seen in a sectional direction.

FIG. 10B shows an example in which the trench 722 is uniformly arranged on four sides in a circumferential direction of the head portion 720b and FIG. 10C shows an example in which the trench 723 is uniformly arranged on three sides of the head portion 720b.

With the formation of the trench 722 to be the inclined surface in which an outside is placed in a higher position from the vicinal position of the center of a lower surface of the protruded portion 720c toward the outer peripheral edge of the head portion 720b, thus, a void in a solder 14 is discharged along the trench 722 in a portion in which the trench 722 is formed (a position of a C-C line in FIG. 10B) as shown in FIG. 9B. In particular, the trench 722 is formed to communicate from the protruded portion 720c to the head portion 720b. Consequently, there is an advantage that it is possible to easily discharge, through the trench 722, a void which is generated in the vicinity of the connecting pad 12 (a position of a bottom of the protruded portion 720c) and is discharged with difficulty.

Figure 11A:
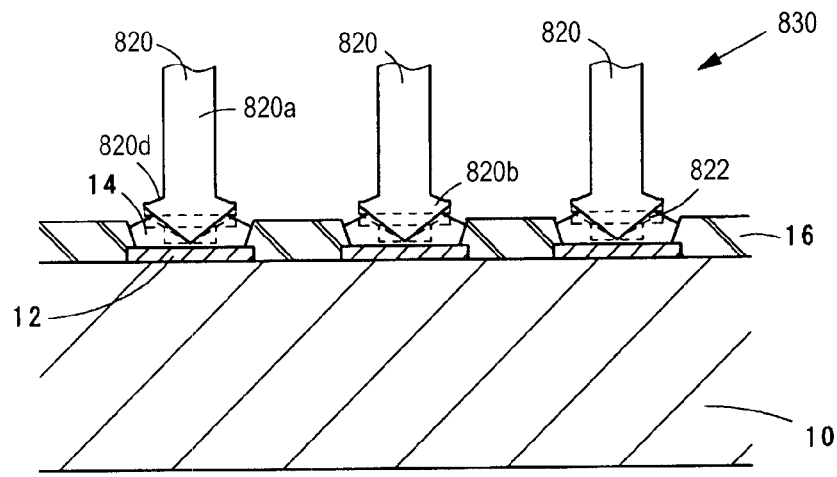
FIGS. 11A and 11B are sectional views showing a variant of the seventh embodiment and FIG. 11C is a front view showing the lead pin.
Figure 11B:
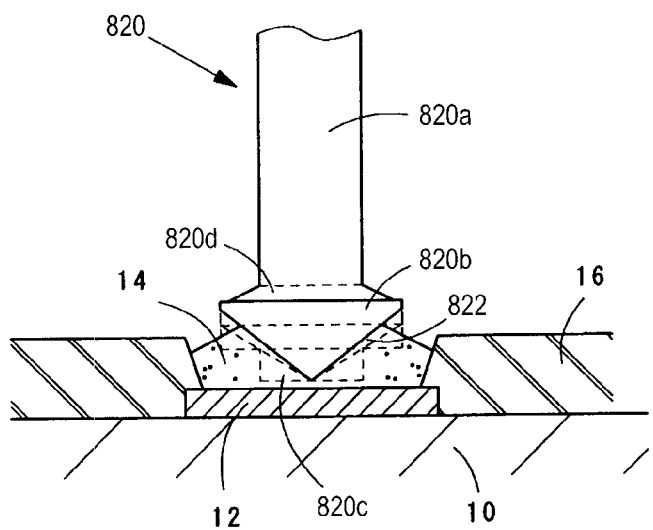
Figure 11C:
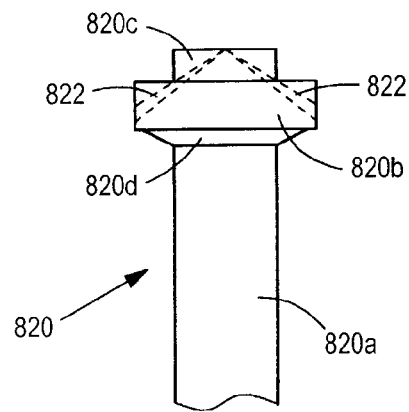

FIGS. 11A to 11C show a variant of the seventh exemplary embodiment. In the wiring board 830 having a lead pin according to the variant, there is used a lead pin 820 in which a taper portion 820d is formed in positions of base parts of a head portion 820b and a shaft portion 820a. The lead pin 820 includes a protruded portion 820c which is protruded like a short cylinder from an opposite surface to a surface of a head portion 820b to which a shaft portion 820a is coupled, and a trench 822 for discharging a void is provided from the protruded portion 820c to the head portion 820b.

FIGS. 11A and 11B are sectional views showing the wiring board 830 having the lead pin and FIG. 11C is a front view showing the lead pin 820.

In the variant, the taper portion 820d is provided in the positions of the base parts of the head portion 820b and the shaft portion 820a. Consequently, it is possible to enhance a strength of a coupling part of the head portion 820b and the shaft portion 820a. Thus, it is possible to enhance a pull strength in a bond of the lead pin 820 to a connecting pad 12 more greatly as compared with the example shown in FIGS. 10A to 10C.

In the wiring board 730 having the lead pin and the lead pin 720 shown in FIGS. 9A to 10B, it is preferable to properly set the configuration of the trench 722 to be formed from the protruded portion 720c to the head portion 720b and the number of the trenches 722 to be arranged in consideration of a discharging efficiency of the void. In the wiring board 830 having the lead pin and the lead pin 820 shown in FIGS. 11A to 11C, this configuration can also be employed.

In the lead pin 720 in which the trench 722 is formed on the protruded portion 720c and the head portion 720b, it is possible to increase the bonding area of the solder 14 to the lead pin 720, thereby enhancing the bonding strength of the lead pin 720 more greatly as compared with a lead pin in which the protruded portion 20c is simply formed.

Referring to the method of forming the trench 722 on the protruded portion 720c and the head portion 720b, moreover, there is also an advantage that it is possible to enhance a pull strength in the bond of the lead pin 720 to the connecting pad 12 without damaging the strength of the lead pin 720 itself.

In the seventh exemplary embodiments, it is possible to use various solders 14 as a conductive material for bonding the lead pin 720 to the connecting pad 12. For example, also in the case in which a tin based solder such as a tin—antimony alloy solder is used as a lead-free conductive material, it is possible to obtain completely the same functions and effects. Moreover, it is a matter of course that a conductive material other than the solder can also be used as a conductive material for bonding.

Example of Design

Figure 12:
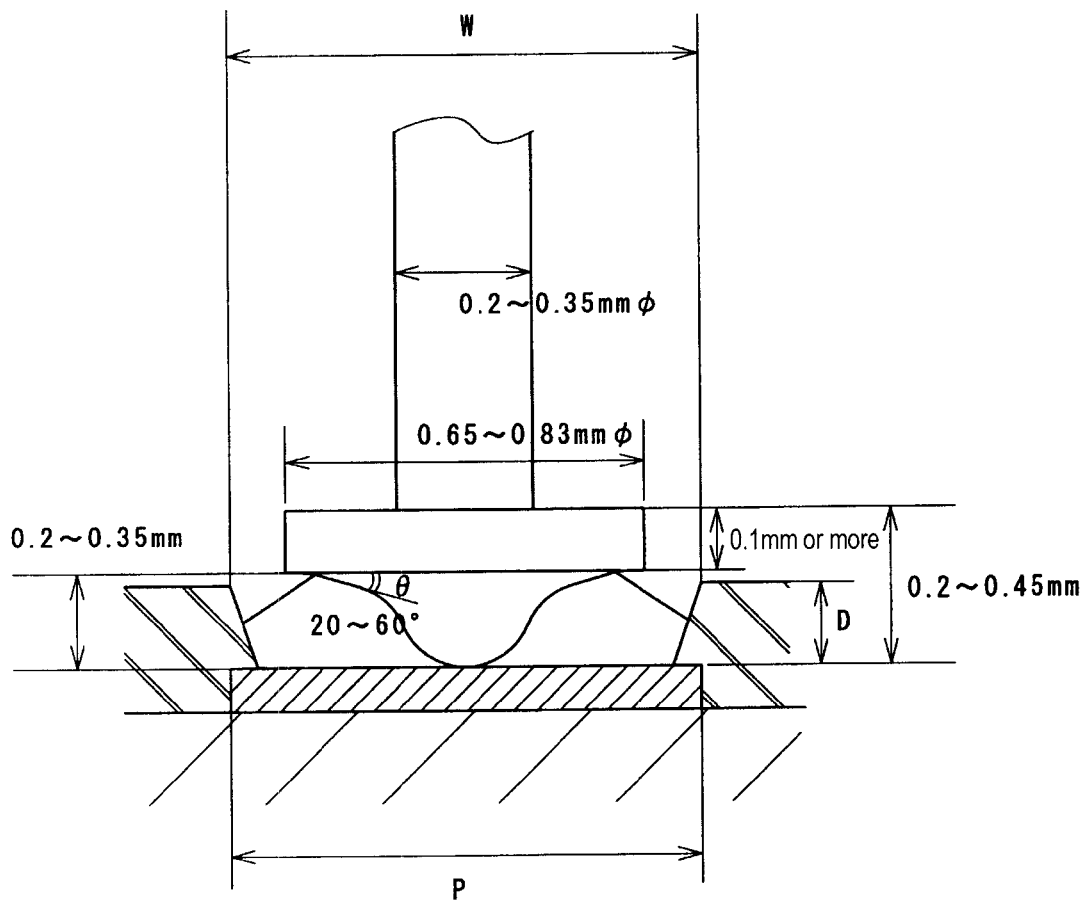
FIG. 12 is an explanatory view showing an example of a design of the lead pin.
Figure 13:
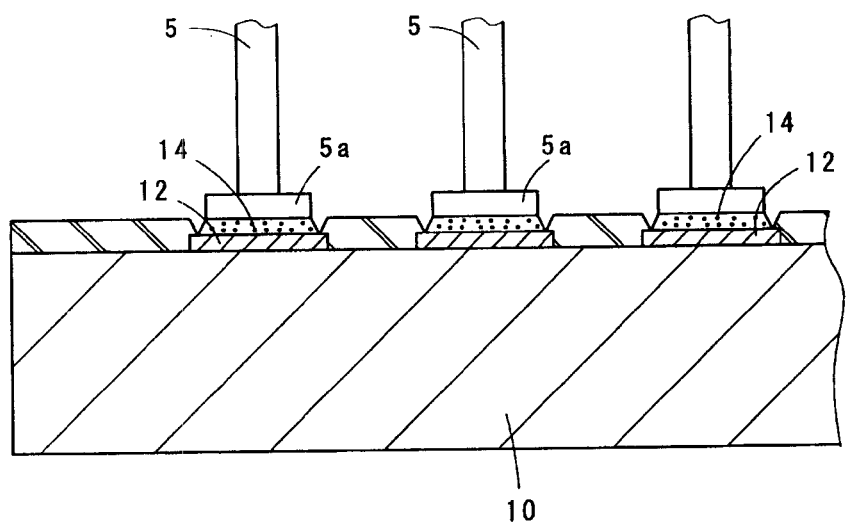
FIG. 13 is a sectional view showing a related-art structure of a wiring board having a lead pin in which a lead pin taking a shape of a flat pin is bonded.
Figure 14A:
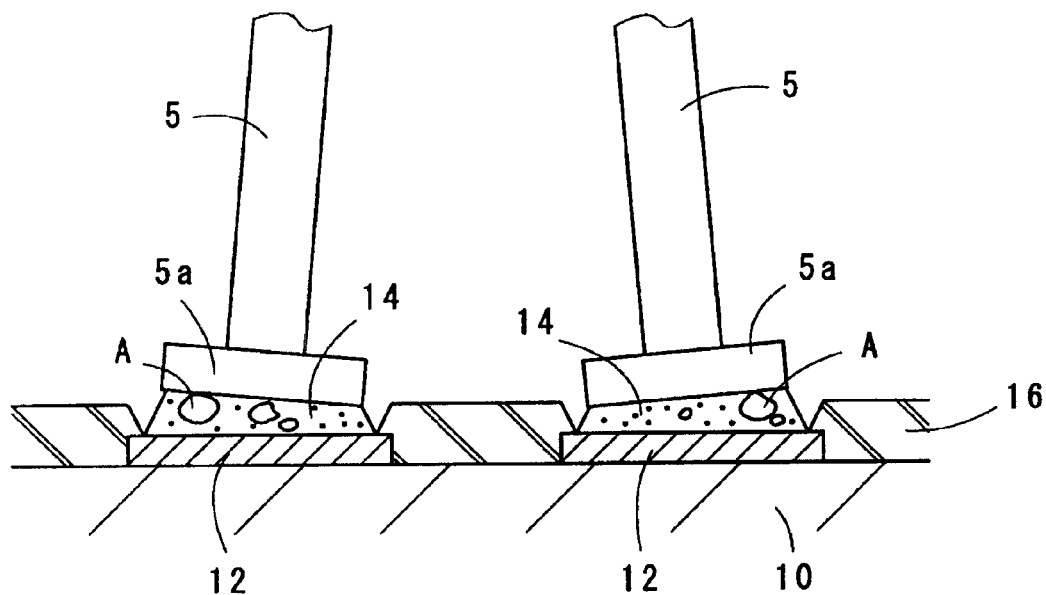
FIGS. 14A and 14B are explanatory views showing a bonding state of a lead pin in the related-art wiring board having the lead pin.
Figure 14B:
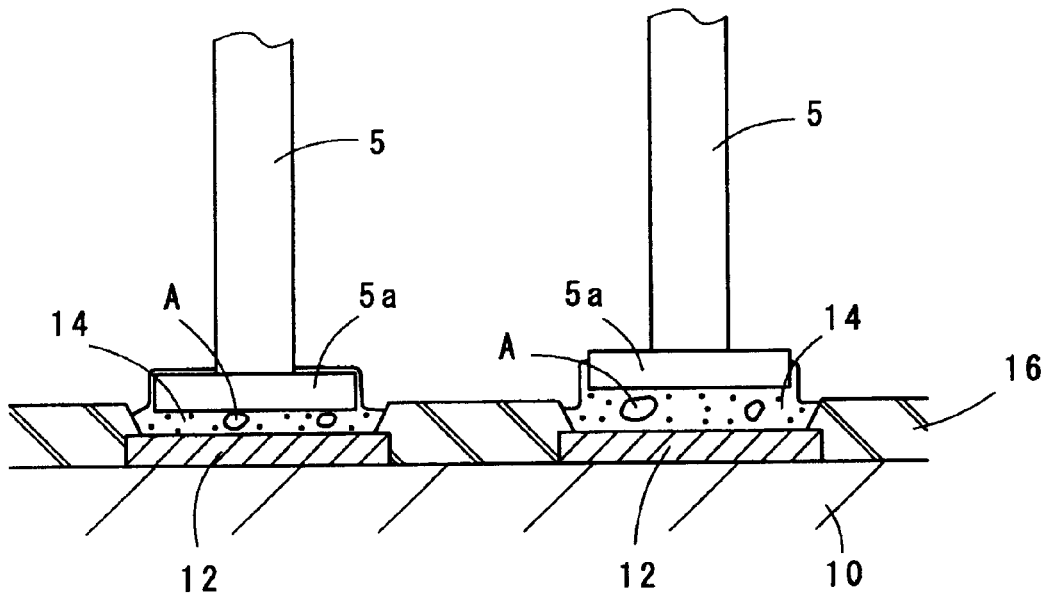

FIG. 12 shows an example of a design for a lead pin used actually in a wiring board having a lead pin and a connecting pad of the wiring board. In the lead pin used actually, a range of a diameter of a shaft portion was set to be 0.2 to 0.35 mm, a range of an outside diameter of a head portion was set to be 0.65 mm to 0.83 mm, a range of a height from an upper surface of the head portion to a tip of a protruded portion was set to be 0.2 to 0.45 mm, and a range of a height of the protruded portion protruded from the head portion was set to be 0.2 to 0.35 mm. A thickness of the head portion is set to be 0.1 mm or more in consideration of a prevention of a solder from being protruded toward the shaft portion upward and a formation of the trenches 521, 522, 621, 722, 723 and 822 on the head portion.

Referring to the wiring board, a range of a pad diameter P is set to be 0.75 to 1.18 mm, a range of a layer thickness D of a solder resist is set to be 0.01 to 0.1 mm, and a range of an opening diameter W of the solder resist is set to be 0.75 to 1.18 mm. An outside diameter of the head portion is set to be slightly smaller than the opening diameter of the solder resist. Moreover, the thickness of the solder resist is set to be smaller than a height of a projection.

The lead pin of this invention is formed by a metal such as a nickel-iron alloy like a "kovar" or "alloy 42", or a copper alloy, etc. As a example, nickel plating and gold plating are carried out over a surface of the lead pin in this order, for protecting the surface or improving the solder wettability of the lead pin.

Based on the dimensions such as the pad diameter and the dimensions of the respective portions in the lead pin, it is possible to prevent the solder from being protruded toward the shaft portion side of the lead pin in an upward direction, thereby enhancing the bonding strength of the connecting pad and the lead pin.

The outside diameter of the protruded portion is usually set to be equal to that of the shaft portion. In the case in which a trench for discharging a void is formed, however, it is preferable that the outside diameter of the protruded portion should be larger than that of the shaft portion. By setting an angle θ formed by a base part of the protruded portion and the head portion to be 20 to 60 degrees, it is possible to take an action for discharging a void from an inside of a solder, thereby bonding the lead pin to the connecting pad.

While the present inventive concept has been shown and described with reference to certain exemplary embodiments thereof, it will be understood by those skilled in the art that various changes in form and details may be made therein without departing from the spirit and scope of the invention as defined by the appended claims.

What is claimed is:

1. A wiring board having a lead pin comprising:
a connecting pad which is formed on the wiring board, and to which the lead pin is bonded through a conductive material,
wherein the lead pin includes:
a shaft portion;
a head portion which is provided on one end of the shaft portion, said head portion having a diameter greater than that of the shaft portion;
a protruded portion which is formed on a surface side of the head portion opposed to the connecting pad, the protruded portion formed to take a hemispherical shape which is convexed toward the connecting pad, the hemispherical shaped protruded portion having a diameter which is less than the diameter of the head portion;
a first taper portion which is formed between the head portion and a base part of the shaft portion, said first taper portion tapering outwardly from the base part of the shaft portion toward an outer edge of the head portion; and
a second taper portion which is formed between the head portion and a base part of the protruded portion, wherein the base part of the protruded portion is provided at an angle relative to the second taper portion.

2. The wiring board having a lead pin according to claim 1, wherein a planer shape of the head portion is formed in a circular flat plate manner,
and wherein the protruded portion is concentric with the shaft portion and is protruded from the head portion.

3. The wiring board having a lead pin according to claim 1, wherein the first and second taper portions take such a shape as to divide the head portion into two parts in a vertical direction.

4. The wiring board having a lead pin according to claim 1, wherein a trench is formed between the base part of the protruded portion and an outer peripheral edge of the head portion.

5. The wiring board having a lead pin according to claim 1, wherein a trench is formed in a communicating arrangement between the protruded portion and an outer peripheral edge of the head portion.

6. The wiring board having a lead pin according to claim 1, wherein the first taper portion tapers extends at a non-perpendicular angle from the shaft portion toward the outer edge of the head portion.

7. The wiring board having a lead pin according to claim 1, wherein the head portion has a cylindrical shape.

8. A wiring board having a lead pin comprising:
a connecting pad which is formed on the wiring board, and to which the lead pin is bonded through a conductive material,
wherein the lead pin includes:
a shaft portion;
a head portion which is provided on one end of the shaft portion, said head portion having a diameter greater than that of the shaft portion;
a protruded portion which is formed on a surface side of the head portion opposed to the connecting pad, the protruded portion formed to take a conical shape having a rounded tip part such that a diameter of the protruded portion gradually decreases from a base part of the protruded portion to the tip part of the protruded portion opposed to the connecting pad;
a first taper portion which is formed between the head portion and a base part of the shaft portion, said first taper portion tapering outwardly from the base part of the shaft portion toward an outer edge of the head portion; and
a second taper portion which is formed between the head portion and the base part of the protruded portion, wherein the protruded portion projects from the second taper portion such that the base part of the protruded portion is provided at an angle relative to the second taper portion.

9. The wiring board having a lead pin according to claim 1, wherein an external surface of the protruded portion and the head portion are smoothly connected to each other through a continuous curved surface.

10. The wiring board having a lead pin according to claim 8, wherein an external surface of the protruded portion and the head portion are smoothly connected to each other through a continuous curved surface.

11. A lead pin bonded through a conductive material to a connecting pad formed on a wiring board, comprising:
a shaft portion;
a head portion which is provided on one end of the shaft portion, said head portion having a diameter greater than that of the shaft portion;
a protruded portion which is formed on a surface side of the head portion opposed to the connection pad, the protruded portion formed to take a hemispherical shape which is convexed toward the connecting pad, the hemispherical shaped protruded portion having a diameter which is less than the diameter of the head portion;
a first taper portion which is formed between the head portion and a base part of the shaft portion, said first taper portion tapering outwardly from the base part of the shaft portion toward an outer edge of the head portion; and
a second taper portion formed between the head portion and a base part of the protruded portion, wherein the base part of the protruded portion is provided at an angle relative to the second taper portion.

12. The lead pin according to claim 11, wherein a planer shape of the head portion is formed in a circular flat plate manner, and the protruded portion is concentric with the shaft portion and is protruded from the head portion.

13. The lead pin according to claim 11, wherein each of the first and second taper portions take such a shape as to divide the head portion into two parts in a vertical direction.

14. The lead pin according to claim 11, wherein a trench is formed from the base part of the protruded portion to an outer peripheral edge of the head portion.

15. The lead pin according to claim 11, wherein a trench is formed in a communicating arrangement between the protruded portion and an outer peripheral edge of the head portion.

16. The lead pin according to claim 11, wherein an external surface of the protruded portion and the head portion are smoothly connected to each other through a continuous curved surface.

17. The lead pin according to claim 11, wherein the first taper portion tapers extends at a non-perpendicular angle from the shaft portion toward the outer edge of the head portion.

18. The lead pin according to claim 11, wherein the head portion has a cylindrical shape.

19. A lead pin bonded through a conductive material to a connecting pad formed on a wiring board, comprising:
a shaft portion;
a head portion which is provided on one end of the shaft portion, said head portion having a diameter greater than that of the shaft portion;
a protruded portion which is formed on a surface side of the head portion opposed to the connection pad, the protruded portion formed to take a conical shape having a rounded tip part such that a diameter of the protruded portion gradually decreases from a base part of the protruded portion to the tip part of the protruded portion opposed to the connecting pad;
a first taper portion which is formed between the head portion and a base part of the shaft portion, said first taper portion tapering outwardly from the base part of the shaft portion toward an outer edge of the head portion; and
a second taper portion is formed between the head portion and the base part of the protruded portion, and the protruded portion projects from the second taper portion such that the base part of the protruded portion is provided at an angle relative to the second taper portion.

20. The lead pin according to claim 19, wherein an external surface of the protruded portion and the head portion are smoothly connected to each other through a continuous curved surface.

* * * * *